United States Patent
Fork et al.

(10) Patent No.: US 8,692,110 B2
(45) Date of Patent: Apr. 8, 2014

(54) MELT PLANARIZATION OF SOLAR CELL BUS BARS

(75) Inventors: David K. Fork, Mountain View, CA (US); Andre Kalio, Palo Alto, CA (US); Ranjeet Rao, Mountain View, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 319 days.

(21) Appl. No.: 12/905,975

(22) Filed: Oct. 15, 2010

(65) Prior Publication Data
US 2011/0023961 A1    Feb. 3, 2011

Related U.S. Application Data

(62) Division of application No. 12/277,201, filed on Nov. 24, 2008, now Pat. No. 8,080,729.

(51) Int. Cl.
*H01L 31/00* (2006.01)
(52) U.S. Cl.
USPC .......................................................... 136/256
(58) Field of Classification Search
None
See application file for complete search history.

(56) References Cited

U.S. PATENT DOCUMENTS

| | | |
|---|---|---|
| 2,031,387 A | 2/1936 | Schwarz |
| 2,326,803 A | 8/1943 | Samiran |
| 2,761,791 A | 9/1956 | Russell |
| 2,789,731 A | 4/1957 | Marraffino |
| 3,032,008 A | 5/1962 | Land et al. |
| 3,159,313 A | 12/1964 | Guilford |
| 3,602,193 A | 8/1971 | Adams et al. |
| 4,018,367 A | 4/1977 | Morine et al. |
| 4,119,058 A | 10/1978 | Schmermund |
| 4,141,231 A | 2/1979 | Kudlich |
| 4,254,894 A | 3/1981 | Fetters |

(Continued)

FOREIGN PATENT DOCUMENTS

| | | |
|---|---|---|
| DE | 102006011580 B3 | 10/2007 |
| EP | 1787786 A | 5/2007 |

(Continued)

OTHER PUBLICATIONS

Finlayson et al. "Bi2O3-Wo3 compounds for photocatalytic applications by solid state and viscous processing", Title from a conference scheduled for Oct. 6-7, 2004 in Munich, 8 pages.

(Continued)

*Primary Examiner* — Jennifer Michener
*Assistant Examiner* — Shannon Gardner
(74) *Attorney, Agent, or Firm* — Bever, Hoffman & Harms, LLP; Patrick T. Bever

(57) ABSTRACT

Solar cells include bus bars and high aspect-ratio gridlines that are printed on a substrate, and localized melting is induced to slump or flatten the gridline "vertex" portions that are disposed on the bus bars, while maintaining the high aspect-ratio of gridlines portions disposed on the substrate between the bus bars. The localized melting process is induced using one of several disclosed methods, such as rheological melting in which the two printed inks produce a compound that is relatively liquid. Localized melting is also induced using a deliquescing material (e.g., a flux or a solvent film) that is applied to the bus bar or gridline material. Also, eutectic melting is induced using a processing temperature that is between a melting point of the combined gridline/bus bar inks and the individual melting points of the inks alone. Laser-based melting and the use of copolymers is also disclosed.

3 Claims, 9 Drawing Sheets

(56) References Cited

U.S. PATENT DOCUMENTS

| | | |
|---|---|---|
| 4,301,322 A | 11/1981 | Amick |
| 4,418,640 A | 12/1983 | Dettelbach et al. |
| 4,420,510 A | 12/1983 | Kunkel et al. |
| 4,461,403 A | 7/1984 | Prahs |
| 4,476,165 A | 10/1984 | McIntyre |
| 4,490,418 A | 12/1984 | Yoshida |
| 4,521,457 A | 6/1985 | Russell et al. |
| 4,747,517 A | 5/1988 | Hart |
| 4,938,994 A | 7/1990 | Choinski |
| 4,985,715 A | 1/1991 | Cyphert et al. |
| 5,000,988 A | 3/1991 | Inoue et al. |
| 5,120,484 A | 6/1992 | Cloeren |
| 5,151,377 A | 9/1992 | Hanoka et al. |
| 5,188,789 A | 2/1993 | Nishiura |
| 5,254,388 A | 10/1993 | Melby et al. |
| 5,353,813 A | 10/1994 | Deevi et al. |
| 5,536,313 A | 7/1996 | Watanabe et al. |
| 5,560,518 A | 10/1996 | Catterall et al. |
| 5,590,818 A | 1/1997 | Raba et al. |
| 5,605,720 A | 2/1997 | Allen et al. |
| 5,679,379 A | 10/1997 | Fabricante et al. |
| 5,700,325 A | 12/1997 | Watanabe |
| 5,733,608 A | 3/1998 | Kessel et al. |
| 5,873,495 A | 2/1999 | Saint-Germain |
| 5,918,771 A | 7/1999 | van der Heijden |
| 6,047,862 A | 4/2000 | Davies |
| 6,184,458 B1 * | 2/2001 | Murakami et al. ............ 136/256 |
| 6,257,450 B1 | 7/2001 | Jackson et al. |
| 6,293,498 B1 | 9/2001 | Stanko et al. |
| 6,375,311 B1 | 4/2002 | Kuramoto |
| 6,398,370 B1 | 6/2002 | Chiu et al. |
| 6,418,986 B1 | 7/2002 | Gabriele |
| 6,423,140 B1 | 7/2002 | Liu et al. |
| 6,529,220 B1 | 3/2003 | Matsumoto |
| 6,558,146 B1 | 5/2003 | Shah et al. |
| 6,666,165 B2 | 12/2003 | Shiraishi et al. |
| 6,743,478 B1 | 6/2004 | Kiiha et al. |
| 6,863,923 B1 * | 3/2005 | Kalleder et al. ............. 427/226 |
| 6,890,167 B1 | 5/2005 | Kwok et al. |
| 6,955,348 B2 | 10/2005 | Koga |
| 7,101,592 B2 | 9/2006 | Gueggi et al. |
| 7,160,574 B1 | 1/2007 | Gillanders et al. |
| 7,765,949 B2 | 8/2010 | Fork et al. |
| 7,780,812 B2 | 8/2010 | Fork et al. |
| 2001/0053420 A1 | 12/2001 | Donges et al. |
| 2002/0083895 A1 | 7/2002 | Nakamura et al. |
| 2003/0015820 A1 | 1/2003 | Yamazaki et al. |
| 2003/0201581 A1 | 10/2003 | Weber et al. |
| 2004/0259382 A1 | 12/2004 | Nishimura et al. |
| 2004/0265407 A1 | 12/2004 | Prugh et al. |
| 2005/0067729 A1 | 3/2005 | Laver et al. |
| 2005/0194037 A1 | 9/2005 | Asai |
| 2005/0221613 A1 | 10/2005 | Ozaki et al. |
| 2006/0158473 A1 | 7/2006 | Mills et al. |
| 2007/0108229 A1 | 5/2007 | Fork et al. |
| 2007/0110836 A1 | 5/2007 | Fork et al. |
| 2007/0209697 A1 * | 9/2007 | Karakida et al. ............. 136/256 |
| 2008/0029152 A1 | 2/2008 | Milshtein et al. |
| 2008/0138456 A1 | 6/2008 | Fork et al. |
| 2009/0101190 A1 | 4/2009 | Salami et al. |
| 2010/0116199 A1 | 5/2010 | Fork et al. |
| 2010/0117254 A1 | 5/2010 | Fork et al. |

FOREIGN PATENT DOCUMENTS

| | | |
|---|---|---|
| EP | 1918245 A2 | 5/2008 |
| JP | 60082680 A | 5/1985 |
| JP | 05-031786 A | 2/1993 |
| JP | 2005051216 | 2/2005 |
| WO | 91/15355 | 10/1991 |
| WO | 00/50215 | 8/2000 |
| WO | 03/076701 A | 9/2003 |
| WO | 2005/070224 A1 | 8/2005 |
| WO | 2005/107957 A1 | 11/2005 |
| WO | 2005/107958 A1 | 11/2005 |
| WO | 2010061394 A1 | 6/2010 |

OTHER PUBLICATIONS

Mueller et al. "Breathable Polymer Films Produced by the Microlayer Coextrusion Process", Journal of Applied Polymer Science, vol. 78, pp. 816-828, 2000.

Schweizer, Peter M. "Curtain Coating Technology Can Mean Big Benefits", Paper, Film & Foil Converter website, Mar. 1, 2000, 5 pages, http://pffc-online.com/mag/paper_curtain_coating_technology/.

Citsco, Gimac Compact Triplex TR12 Micro-Coextrusion Plant, NPE 2000, Jun. 19-23, 2000, McCormick Place, Chicago, IL, Booth 13154, http://www.citsco.com/NPE2000/npepage1.html, 2 pages.

Rao et al. "Microfabricated Deposition Nozzles for Direct-Write Assembly of Three-Dimensional Periodic Structures", Advanced Materials, vol. 17, No. 3, Feb. 10, 2005, pp. 289-293.

Van Hoy et al. "Microfabrication of Ceramics by Co-extrusion", J. Am. Ceram. Soc., vol. 81, No. 1, pp. 152-158, 1998.

Duncan, A. B. et al. "Charge Optimization for a Triangular-Shaped Etched Micro Heat Pipe", J. Thermophysics, 1994, vol. 9, No. 2, Technical Notes, pp. 365-368.

Joshi et al. "Micro and Meso Scale Compact Heat Exchangers in Electronics Thermal Management—A Review", Proc. of 5th Int. Conf. on Enhanced, Compact and Ultra-Compact Heat Exchangers: Science, Engineering and Technology, Eds. R. K. Shah et al., Engineering Conferences Intenatonal, Hoboken, NJ, USA, Sep. 2005, pp. 162-179.

Le Berre et al. "Fabrication and experimental investigation of silicon micro heat pipes for cooling electronics", J. Micromech. Microeng. 13 (2003) 436-441.

Sobhan, Choondal B. "Modeling of the Flow and Heat Transfer in Micro Heat Pipes", ASME 2nd International Conference on Microchannels and Minichannels, 2004, pp. 883-890.

Sobhan, C. B. et al. "A review and comparative study of the investigations on micro heat pipes", Int. J. Energy Res., 2007, vol. 31, pp. 664-688.

Wang, Y. X. et al. "Investigation of the Temperature Distribution on Radiator Fins with Micro Heat Pipes", J. Thermophysics and Heat Transfer, vol. 15, No. 1, Jan.-Mar. 2001, pp. 42-49.

* cited by examiner

MELT PLANARIZATION OF SOLAR CELL BUS BARS

RELATED APPLICATIONS

This application is a divisional of U.S. patent application Ser. No. 12/277,201, entitled "Melt Planarization Of Solar Cell Bus Bars" filed Nov. 24, 2008.

FIELD OF THE INVENTION

The present invention is related to integrated circuit (IC) devices, and more particularly to IC devices that include bus bars, such as solar cells.

BACKGROUND

FIG. 9 is a simplified diagram showing an exemplary conventional solar cell 40 formed on a semiconductor substrate 41 that converts sunlight into electricity by the inner photoelectric effect. Solar cell 40 is formed on a semiconductor substrate 41 that is processed using known techniques to include an n-type doped upper region 41N and a p-type doped lower region 41P such that a pn-junction is formed near the center of substrate 41. Disposed on an upper surface 42 of semiconductor substrate 41 are a series of parallel metal gridlines (fingers) 44 (shown in end view) that are electrically connected to n-type region 41N. A substantially solid conductive layer 46 is formed on a lower surface 43 of substrate 41, and is electrically connected to p-type region 41P. An antireflection coating 47 is typically formed over upper surface 42 of substrate 41. Solar cell 40 generates electricity when a photon from sunlight beams L1 pass through upper surface 42 into substrate 41 and hit a semiconductor material atom with an energy greater than the semiconductor band gap, which excites an electron ("−") in the valence band to the conduction band, allowing the electron and an associated hole ("+") to flow within substrate 41. The pn-junction separating n-type region 41N and p-type region 41P serves to prevent recombination of the excited electrons with the holes, thereby generating a potential difference that can be applied to a load by way of gridlines 44 and conductive layer 46, as indicated in FIG. 9.

FIG. 10 is a perspective view showing the front contact pattern of solar cell 40 in additional detail. The front contact pattern solar cell 40 consists of a rectilinear array of parallel gridlines 44 and one or more much wider collection lines (bus bars) 45 that extend perpendicular to gridlines 44, both disposed on upper surface 42. Gridlines 44 collect electrons (current) from substrate 41 as described above, and bus bars 45 which gather current from gridlines 44. In a photovoltaic module, bus bars 45 become the points to which metal ribbon (not shown) is attached, typically by soldering, with the ribbon being used to electrically connect one cell to another.

Conventional methods for producing the front contact pattern of solar cell 40 typically involve screen-printing both gridlines 44 and bus bars 45 using a metal-bearing ink in a single pass through a mesh with an emulsion pattern. Conventional screen printing techniques typically produce gridlines having a rectangular cross-section with a width W of approximately 100 μm and a height H of approximately 15 μm, producing an aspect ratio of approximately 0.15. There is no buildup of ink at the vertex of the bus bar and the gridline because the entire print has uniform thickness. However, the resulting structure is not necessarily optimal from a cell performance perspective however because the relatively low aspect ratio causes gridlines 44 to generate an undesirably large shadowed surface area (i.e., gridlines 44 prevent a significant amount of sunlight from passing through a large area of upper surface 22 into substrate 21, as depicted in FIG. 9 by light beam L2), which reduces the ability of solar cell 20 to generate electricity. However, simply reducing the width of gridlines 44 (i.e., without increasing the gridlines' cross-sectional area by increasing their height dimension) could undesirably limit the current transmitted to the applied load, and forming high aspect ratio gridlines using screen printing techniques would significantly increase production costs.

Although extrusion printing provides advantages over screen printing (e.g., higher aspect ratio gridlines), these advantages are partially offset by the peaked topography of each vertex 44-1B, i.e., where each gridline 44-1 crosses bus bar 45-1, which can make soldering the stringing metallization (i.e., the metal ribbon) difficult or unreliable. Each vertex 44-1B, as shown in FIG. 11(C), produces an uneven topography on the bus bars 45-1 that does not impact the cell performance, but can create a weak solder joint between the subsequently applied metal ribbon (not shown) and the top of bus bars 45-1 because there is insufficient solder to fill in the gaps between adjacent vertices 44-1B. That is, there is a potential problem with extrusion printing high aspect-ratio gridlines 44-1 on bus bars 45-1 in that, when a ribbon is subsequently soldered to the top of bus bars 45-1, the ribbon is unable to make a strong, broad area connection to bus bars 45-1 because of the ridges caused by gridline portions (vertices) 44-1B. One might consider printing the bus bar over the gridlines in an effort to better planarize the metallization. However, in the case of coextrusion printing, the present inventors have observed that, during the subsequent required firing process, if the gridline material resides beneath the bus bar, the bus bar metal tends to float and separate from the gridlines, causing an open circuit. Furthermore, the bus bar would still have an undulating surface which still might decrease the reliability of the soldered connection. Moreover, it is important to recognize that, once printed, the lower sections of the gridlines need to maintain their overall shape during the drying and firing process that sinters the metal into its conducting state. There is a characteristic shrinkage and densification of the metallization ink, however, the ink does not at any point become liquid which would enable it to flow, as this would cause the metal to ball up on the substrate causing breaks. For this reason, one can not simply planarize the metallization on the bus bars by briefly melting it, as it would damage the device.

What is needed is a micro extrusion printing method and associated apparatus for producing solar cells (and other IC devices that include similar bus bar/gridline arrangements) that facilitates the formation of extruded gridlines and bus bars at a low cost and addresses the problems described above. In particular, what is needed is a method for producing solar cells (and similar devices) that utilizes the benefits of extrusion printing, yet avoids the poor soldering problems caused by the peaked topography where the gridlines cross the bus bars.

SUMMARY OF THE INVENTION

The present invention is directed to solar cells (and other electric electronic and devices) having bus bars and high aspect-ratio gridlines printed on a substrate, wherein localized melting is performed to slump or flatten the gridline "vertex" portions that are disposed on the bus bars, while maintaining the high aspect-ratio of gridlines portions disposed on the substrate between the bus bars. The localized melting thus planarizes the bus bars in order to facilitate reliable connection of metal ribbon (string metallization) without additional processing, thereby avoiding the peaked topography problem associated with the prior art. In addition, critical portions of the metallization structure, namely the gridlines, can remain in the form of highly conductive elemental metals. Further, no mechanical treatment for the fragile wafers is needed, and in some embodiments standard processing techniques can be utilized, thereby minimizing production costs.

According to an embodiment of the present invention, a solar cell includes one or more bus bars that extend in a first direction across the upper surface of a substrate, and parallel gridlines that extend in an orthogonal direction across the upper surface such that each of the gridlines intersects and overlaps the bus bars (i.e., lower (first) gridline portions of each gridline are disposed directly on the upper surface of the substrate, and elevated (second) gridline portions are disposed on the bus bars). The solar cell is characterized in that the bus bars are printed using a first ink having a first chemical composition and a first melting point, and the gridlines are printed using a second ink having a second composition and a second melting point, wherein the first and second chemical compositions are selected such that contact between the elevated gridline portions and the bus bars produces a third chemical composition having a third melting point that is lower that said first and second melting points, thereby facilitating localized melting of the raised gridline portions while allowing the lower sections to maintain their originally-printed cross section. In one specific embodiment, the bus bar (first) ink contains silver alloy (e.g., silver-copper alloy or silver-germanium alloy), and the gridline (second) ink contains either pure silver or a higher silver content alloy than the bus bar. In another specific embodiment, the first and second inks are formed as a colloidal gel that liquefies when combined. In another specific embodiment, each of the first and second inks has an associated unique pH level that changes to a third (different) pH level when the inks are combined.

According to another embodiment of the present invention, a method for producing solar cells includes disposing (e.g., printing, depositing, stamping, or spraying) a first ink to form elongated bus bars on a substrate, printing a second ink to form parallel elongated gridlines that are orthogonal to and overlap the bus bars, and then inducing localized melting of portions of the gridlines that overlap the bus bars without altering the cross-section of portions of the gridlines that is disposed on the substrate. In one embodiment, the printing process is performed by extrusion printing bus bar material (first ink) onto the substrate such that the bus bar material forms elongated, relatively low aspect ratio parallel bus bars in a first (Y-axis) direction, and then turning the printhead (or substrate) and printing the gridline material (second ink) such that the gridline material forms elongated, relatively high aspect ratio parallel gridlines. Each of the elongated gridlines is printed such that it includes lower (first) gridline portions that are formed directly on the substrate surface, and elevated (second) gridline portions that extend between corresponding lower gridline portions and are supported by an associated bus bar. When initially printed, both the lower and elevated gridline portions have an initial cross-section including a first aspect ratio. According to an aspect of the invention, the localized melting process is performed such that the elevated gridline portion slumps (i.e., assumes a melted cross-section having a lower (second) aspect ratio), but the lower gridline portions retain the initial cross-section (i.e., maintain the initial aspect ratio) cross-section.

In accordance with an embodiment of the present invention, localized melting is induced by rheological melting, whereby combining a relatively solid bus bar (first) ink and a relatively solid gridline (second) ink induces localized melting by producing a compound that is relatively liquid (i.e., one of the viscosity and the finite yield stress of the combined material is less than the viscosities/finite yield stresses of the bus bar and gridline inks). For example, the first and second inks may be formed as colloidal gels that liquefy when combined due, for example, to a change in pH level in the combined material. In accordance with a specific embodiment, the rheological melting process is induced or enhanced by the application of ultraviolet (UV) rays and heat. In one embodiment, drying of the bus bar and gridline inks is performed after the localized melting is completed.

In accordance with an embodiment of the present invention, localized melting is enhanced by applying a deliquescing material (e.g., a flux or a solvent film) to the bus bar or gridline inks. In one specific embodiment, the deliquescing material is applied to the bus bar prior to printing the gridlines (i.e., such that the deliquescing material is disposed between the bus bars and elevated portions of the gridlines). In another specific embodiment, the deliquescing material is printed with the bus bar ink, for example, using a co-extrusion process). In yet another specific embodiment, the deliquescing material is printed onto the gridline ink (i.e., after both the bus bar and gridline printing is completed).

According to another embodiment of the present invention, localized eutectic melting of the elevated gridline portions is induced by printing the bus bars using a first material having a first melting point and printing the gridlines using a second material having a second melting point, where the first and second materials are selected such that, when combined (e.g., at least at the locations where the elevated gridline portions overlap an associated bus bar), the resulting composition has a third melting point that is lower than the first and second melting points. Subsequent to printing the gridlines and bus bars, localized melting is induced by heating the substrate to a processing temperature that is between the third melting point temperature and the first and second melting point temperatures (i.e., greater than the melting point of the combined material, but less than the melting point of the individual gridline and bus bar ink material). In a specific embodiment, Eutectic melting is achieved by printing the bus bar using a silver-copper alloy (first) ink, and printing the gridline using silver (second) ink, with eutectic melting being included by placing the substrate in an oven maintained between 780° C. and 960° C. In another specific embodiment, a silver-germanium alloy is used in place of silver-copper bus bar ink.

According to yet another embodiment of the present invention, localized melting is achieved using one of a laser-based and a mechanical melting process that targets only the elevated gridline portions. In one embodiment, a high energy laser beam is directed onto the elevated gridline portions and includes sufficient energy to produce ablation and/or melting of the elevated gridline portions.

According to yet another embodiment of the present invention, localized melting is achieved by printing the gridlines using a gel-based gridline ink containing a copolymer in a non-aqueous suspension, and then inducing localized melting by heating the elevated gridline portions such that the copolymer causes the gel to liquefy and flow over the underlying bus bar.

BRIEF DESCRIPTION OF THE DRAWINGS

These and other features, aspects and advantages of the present invention will become better understood with regard to the following description, appended claims, and accompanying drawings, where:

DETAILED DESCRIPTION

The present invention relates to an improvement in micro-extrusion systems. The following description is presented to enable one of ordinary skill in the art to make and use the invention as provided in the context of a particular application and its requirements. As used herein, directional terms such as "upper", "top", "lower", "bottom", "front", "rear", and "lateral" are intended to provide relative positions for purposes of description, and are not intended to designate an absolute frame of reference. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
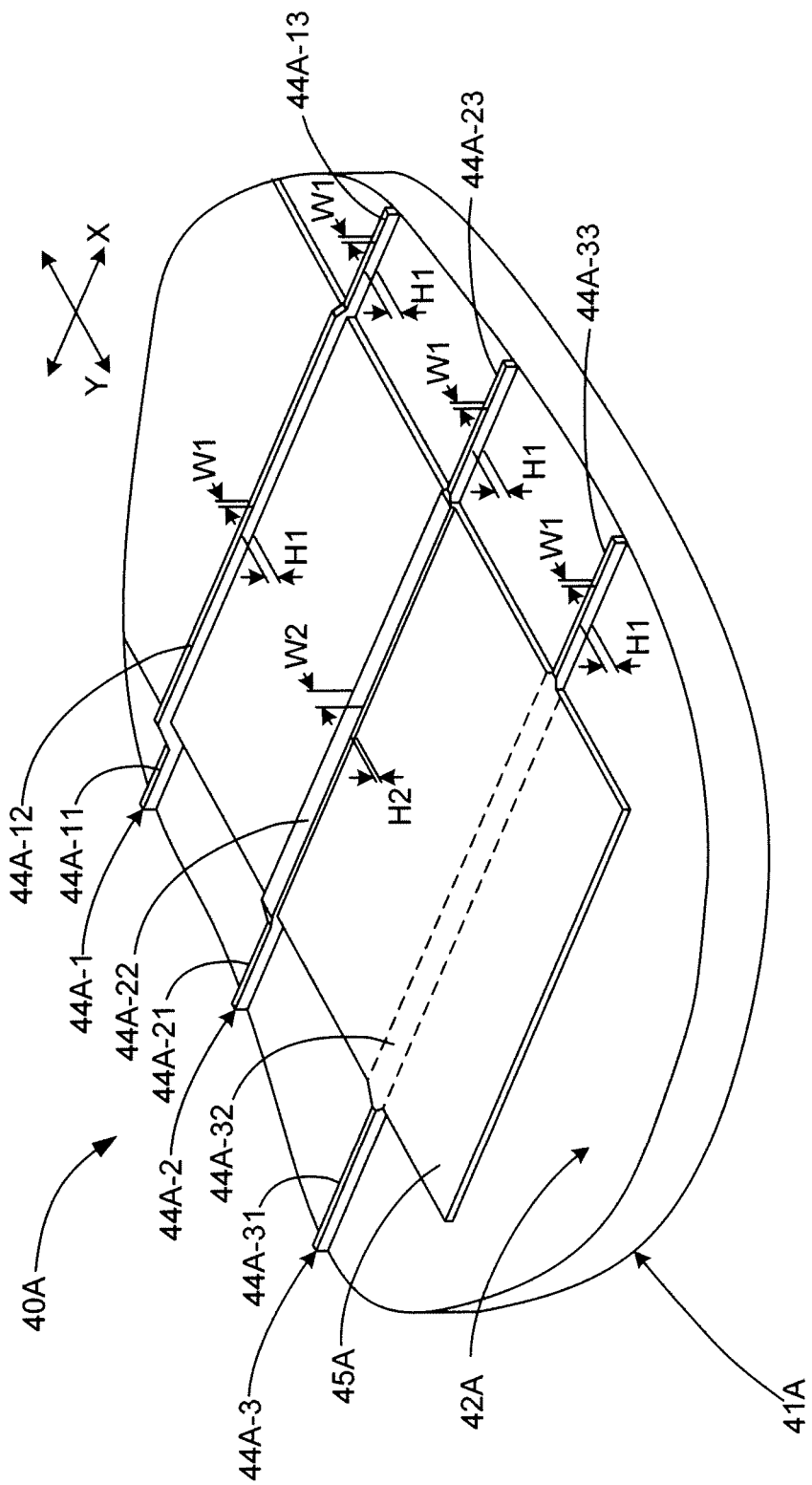
FIG. 1 is a simplified perspective diagram showing a portion of a front side metallization structure associated with a solar cell produced in accordance with an embodiment of the present invention.
Figure 9:
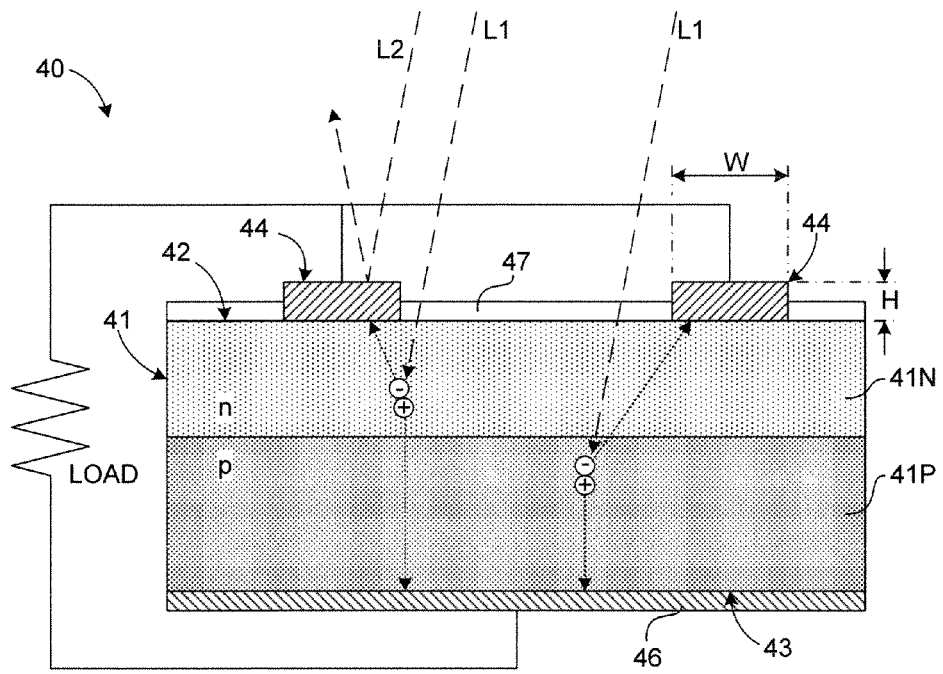
FIG. 9 is a simplified cross-sectional side view showing a conventional solar cell.
Figure 10:
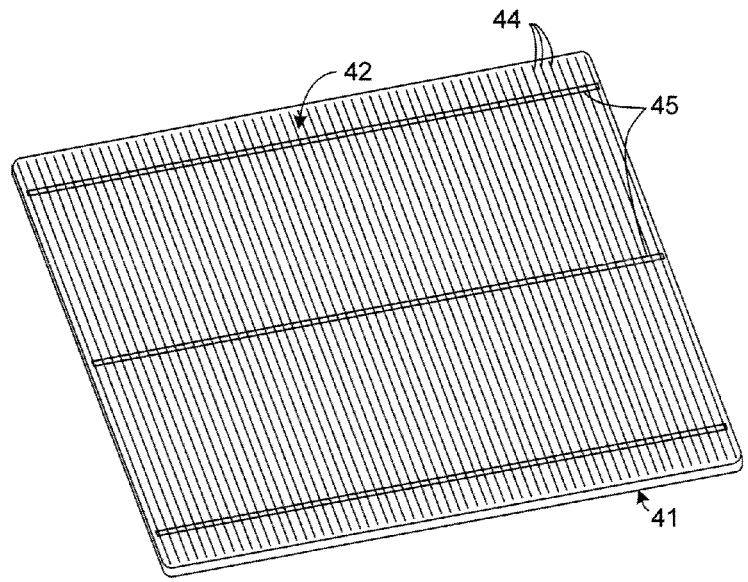
FIG. 10 is a perspective view showing the front-side metallization of a conventional solar cell.
Figure 11A:
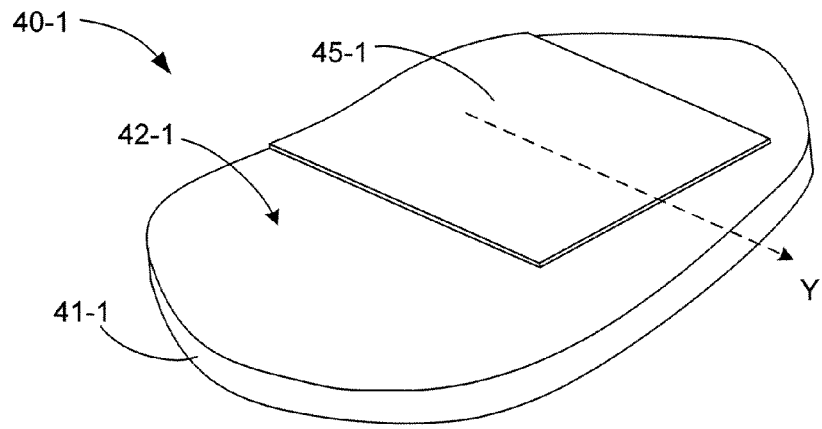
FIGS. 11(A), 11(B) and 11(C) are partial perspective views showing a conventional method for extrusion printing bus lines and grid lines for conventional solar cells.
Figure 11B:
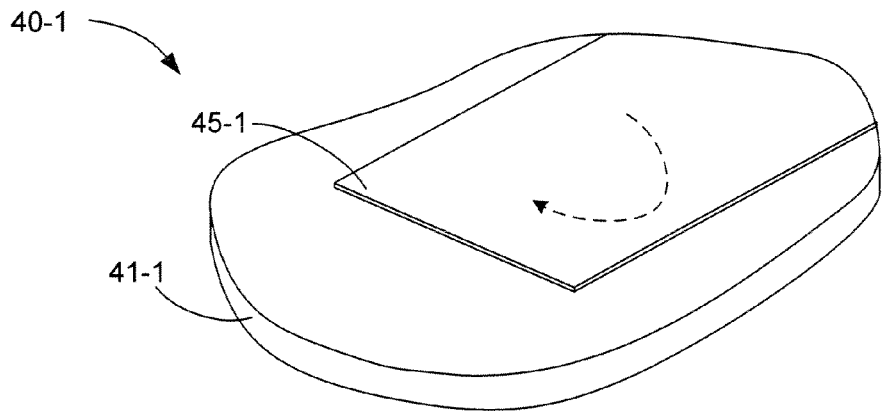
Figure 11C:
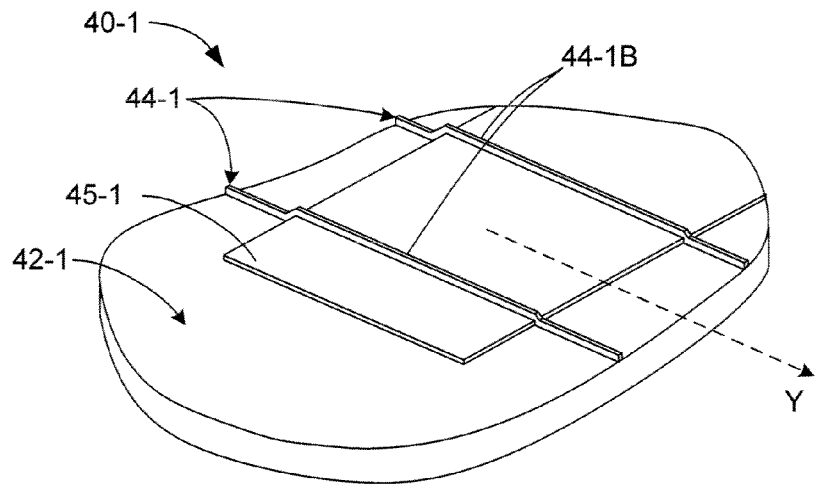

FIG. 1 is a simplified perspective diagram showing a portion of a front side metallization structure associated with a solar cell 40A, which is formed on a substrate 41A having an upper surface 42A. Although not shown, the entirety of solar cell 40A is similar to conventional solar cell 40, described above with reference to FIGS. 9 and 10. The front side metallization shown in FIG. 1 includes a bus bar 45A that extends in the Y-axis (first) direction across upper surface 42A, and parallel gridlines 44A-1, 44A-2 and 44A-3 that extend in the X-axis (second) direction across upper surface 42A. The front side metallization is formed such that bus bar 45A is printed first, and then gridlines 44A-1, 44A-2 and 44A-3 are printed (e.g., after turning substrate 41A 90° relative to the printhead), whereby each gridline 44A-1, 44A-2 and 44A-3 intersects and overlaps bus bars 45A. In particular, each gridline (e.g., gridline 44A-1) includes lower (first) gridline portions (e.g., gridline portions 44A-11 and 44A-13) that are disposed directly on upper surface 42A, and elevated (second) gridline portions (e.g., gridline portion 44A-12) that are disposed on bus bar 45A. Note that the lower gridline portions and elevated gridline portions form a contiguous elongated structure when printed (i.e., respective ends of lower gridline portions 44A-11 and 44A-13 are connected by way of elevated gridline portion 44A-12).

According to an aspect of the invention, gridlines 44A-1 to 44A-3 are printed such that they assume an initial, high aspect ratio cross-section along their entire length, and are then subjected to localized melting during which only the elevated gridline portions 44A-2B are slumped or otherwise deformed to assume a melted cross-section having a second lower aspect ratio. For example, as depicted in FIG. 1, gridline 44A-1 depicts a gridline structure after the gridline printing process but before the localized melting process, and gridlines 44A-2 and 44A-3 depict gridline structures after the localized melting process is completed. An exemplary system and method for printing gridlines having high aspect ratios are described below. Immediately after the printing process, the entirety of each gridline has a substantially uniform cross-section (i.e., as indicated by gridline 44A-1, substantially all lower gridline portions 44A-11 and 44A-13 and elevated gridline portion 44A-12 has a high aspect ratio of approximately one; e.g., a height H1 of approximately 50 microns and width W1 of approximately 50 microns). After localized melting is induced, all of the lower portions of each gridline substantially retain the initial high aspect ratio cross-section (i.e., as indicated by gridlines 44A-2 and 44A-3, lower gridline portions 44A-11, 44A-13, and 44A-31 and 44A-33 retain height H1 of approximately 50 microns and width W1 of approximately 50 microns), but the elevated gridline portions of each gridline are deformed such that they take on a "melted" cross-section having an aspect ratio that is lower than that of the lower gridline sections. For example, elevated gridline portion 44A-22 of gridline 44A-2 is slumped to assume a cross-section having a height H2 of approximately 15 microns and width W2 of approximately 170 microns, and elevated gridline portion 44A-32 of gridline 44A-3 is fully melted (i.e., has substantially no height over the upper surface of bus bar 45A). The present invention thus solves the peaked topography problem associated with prior art methods by providing for local melting of the vertex (i.e., elevated gridline portions), thereby planarizing the bus bar structure to facilitate reliable soldering of a metal ribbon (not shown) to the upper surface of bus bar 45A.

As set forth by the specific examples discussed below, various approaches are presented to achieve the desired localized melting.

According to various embodiments of the present invention set forth below, the gridline ink and bus bar ink that are respectively used to print the gridlines and bus bars are designed such that, in the region where the lines cross (i.e., the "vertex" or elevated gridline portion), the material is design to flow in order to planarize the local area of and around the vertex without compromising the shape and structure of the remainder (i.e., the lower gridline portions) of the printed metallization. That is, referring again to FIG. 1, bus bar 45A is printed using a bus bar (first) ink having a first chemical composition that assumes a substantially solid state after the bus bar printing process, and gridlines 44A-1 to 44A-3 are printed using a gridline (second) ink having a second chemical composition that, at least in the lower gridline portions (i.e., the portions located away from the bus bars), assumes a substantially solid state after the gridline printing process. As set forth in the specific embodiments described below, the chemical compositions of the bus bar and gridline inks are selected such that contact between the elevated gridline portions (e.g., gridline portions 44A-12, 44A-22 and 44A-32; see FIG. 1) and the underlying bus bar structure, either with a deliquescing agent or without a deliquescing agent), produces a third chemical composition that is subject to melting under conditions in which the bus bar and gridline inks (alone) remain substantially solid.

According to a first specific embodiment, localized melting is induced rheologically by printing bus bar ink and gridline ink having first, relatively high viscosities (e.g., greater than 10,000 cP) or a first finite yield stress (e.g., greater than 10 Pascals) such that both inks (alone) are prevented from flowing after being deposited onto the substrate. Once the inks are dried, they are further prevented from flowing. However, a novel feature of these two dissimilar inks is that they are designed to interact (i.e., to form a third chemical composition) that induces localized rheological melting (i.e., forming a low viscosity liquid that is able to flow) at the vertex where the two inks come into contact with each other (e.g., where elevated gridline portions 44A-12, 44A-22 and 44A-32 contact bus bar 45A; see FIG. 1), thereby facilitating planarization of the bus bars.

In accordance with one specific embodiment, rheological melting is realized by forming both inks from colloidal gels in which the gel network is highly sensitive to a parameter such as the pH of the ink. This is achieved for example by using a particle-solvent system that leaves the particles in a charged state and adjusting the pH of the ink to vary the zeta potential of the particles. When the zeta potential of the particles is driven to zero, (the isoelectronic point) the pH adjustment overcomes the mutual electrostatic repulsion of the particles, enabling them to gel. It has been demonstrated that using this method, the viscosity can be varied by orders of magnitude as a function of pH. By extension of this concept, if two inks gel at two different pH levels, when they come into contact, the mutual pH change will cause the interface to un-gel or melt (an additional material added to the gel mixture may be needed to initiate the melting process). This melting will enable faster diffusion, and hence accelerate the melting behavior around the vertex.

In accordance with another specific embodiment, the rheological melting process may be realized by utilizing ink formulas that chemically interact on the vertex to produce a sensitive material (e.g., to UV energy or heat) in order to lower the gridline viscosity. One aspect of this embodiment is that the melting process is induced before the inks are dried. After the inks have been dried, the above described melting would not occur because the solvent is gone.

In another specific embodiment of this invention, localized melting at the gridline-bus bar vertex is induced by introducing an additional chemical (deliquescing material) such as a solvent (e.g., Texanol ester alcohol, available from Eastman Chemical Company), a flux or another material that wets the vertex and helps it to deliquesce. As set forth below, the deliquescing material is applied to either to the elevated gridline portions comprises applying one of a solvent film and a flux onto said one or more bus bars prior to printing said second ink. This embodiment has the advantage of possibly requiring fewer changes to the ink chemistry, allowing the use of conventional techniques to produce gridline and bus bar inks. In the case of mono-extrusion printing (described below), this can be done by diluting any conductive ink (e.g., silver), or in co-extrusion printing (also described below) diluting the metal ink and the stabilizing secondary ink of the gridline material (i.e., the elevated "vertex" gridline portion). The deliquescing material (chemical) should evaporate during the firing step, and be activated only on the vertex, e.g., by adding UV or heat sensitive material, or solvent which is applied only on the bus bar.

Figure 2A:
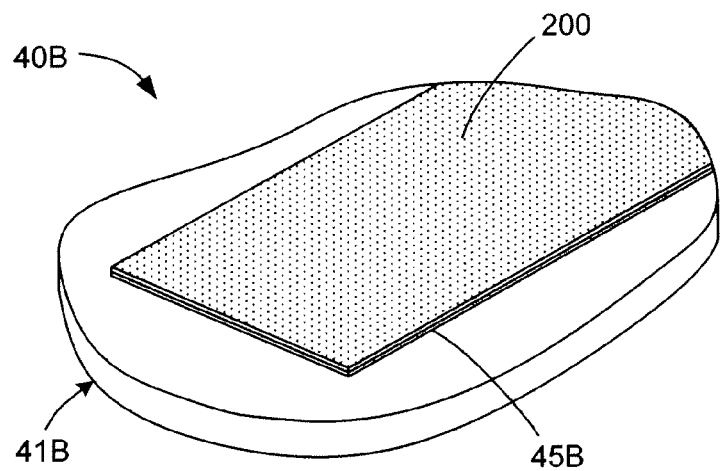
FIGS. 2(A), 2(B) and 2(C) are simplified perspective side views showing a portion of a front side metallization structure during fabrication in accordance with another embodiment of the present invention.
Figure 2B:
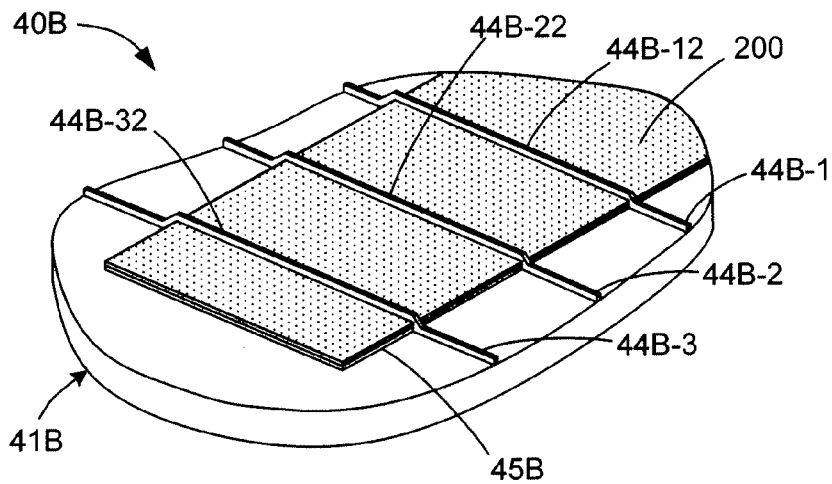
Figure 2C:
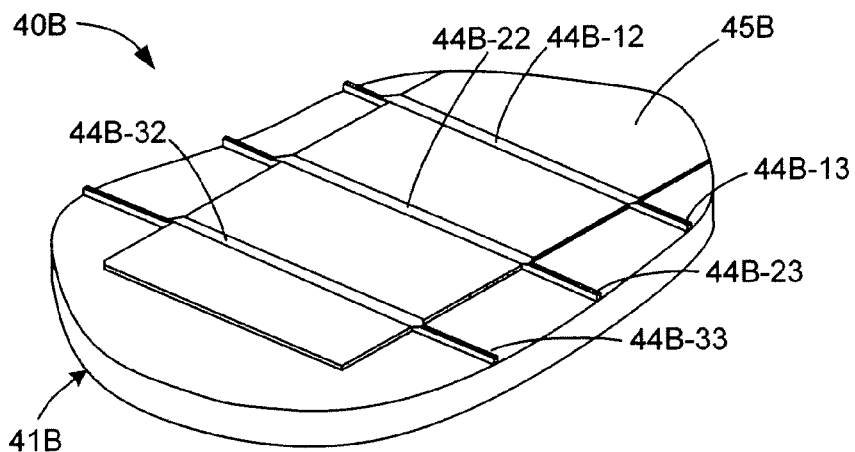

FIGS. 2(A) to 2(C) illustrate a first specific embodiment in for producing a solar cell 40B in which a deliquescing material 200 (e.g., a solvent film or flux) is applied to bus bar 45B (FIG. 2(A)), and then gridlines 44B-1 to 44B-3 are printed (FIG. 2(B)) such that elevated portions 45B-12, 45B-22 and 45B-32 are formed over bus bar 45B with deliquescing material 200 disposed therebetween. The presence of deliquescing material 200 produces localized melting of elevated portions 45B-12, 45B-22 and 45B-32, resulting in the slumped (planarized) structure illustrated in FIG. 2(C).

Figure 3A:
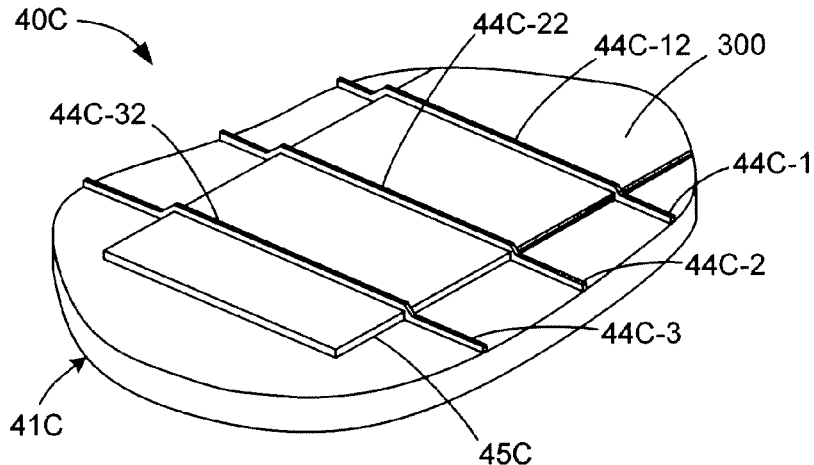
FIGS. 3(A), 3(B) and 3(C) are simplified perspective side views showing a portion of a front side metallization structure during fabrication in accordance with another embodiment of the present invention.
Figure 3B:
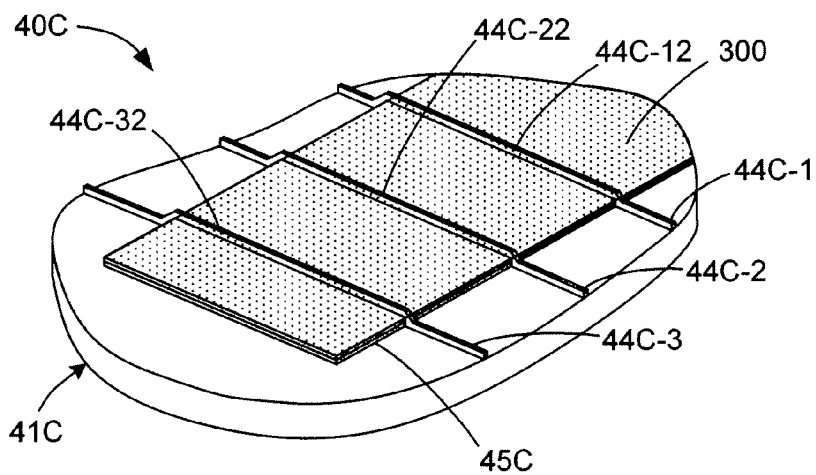
Figure 3C:
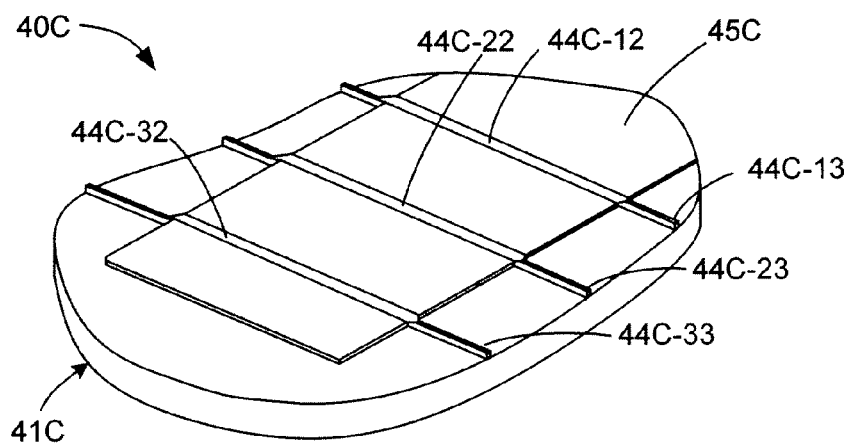

FIGS. 3(A) to 3(C) illustrate another specific embodiment in which, after both bus bar 45C and gridlines 44C-1, 44C-2 and 44C-3 are printed (FIG. 3(A), a deliquescing material 300 (e.g., flux) is applied to elevated gridline portions 44C-12, 44C-22 and 44C-32 (FIG. 3(B)). Note that, in the case of jet printing or jet dispensing techniques, there is the additional possibility of directing drops of the deliquescing material only at elevated gridline portions 44C-12, 44C-22 and 44C-32. A subsequent chemical reaction between deliquescing material 300 and elevated portions 45C-12, 45C-22 and 45C-32 causes localized melting of elevated portions 45C-12, 45C-22 and 45C-32, resulting in the slumped (planarized) structure illustrated in FIG. 3(C).

Although the present invention is described above with reference to rheologic melting and the use of deliquescing materials, other melting techniques may be utilized as well. In one alternative embodiment, eutectic melting is induced using a bus bar ink having a first melting point temperature and a gridline ink having a second melting point temperature. The bus bar and gridline inks are selected such that contact/intermixing between the elevated gridline portions (e.g., 44A-2; see FIG. 1) and underlying bus bar material produces a combined material having third melting point that is lower that the first and second melting points. Subsequent heating of the substrate to a processing temperature that is greater than the third melting point temperature but lower than the first and second melting point temperatures causes localized melting in the region of the vertices, resulting in the desired planarization. That is, neither ink reaches its melting point during the firing process, but where the inks cross, a eutectic alloy is formed with a melting point which resides within the process temperature of the firing profile used to sinter the solar cell metallization. This induces local melting of the solar cell metallization at each bus bar-gridline vertex.

Figure 4A:
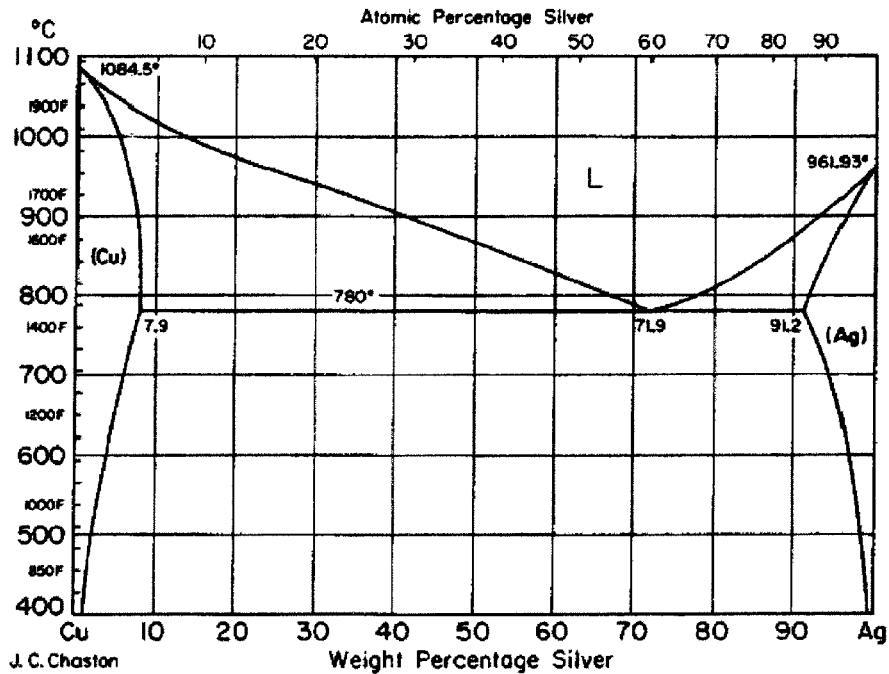
FIGS. 4(A) and 4(B) are silver-copper and silver-germanium phase diagrams, respectively.

During the sintering of conventional pure silver screen printed gridlines, the furnace temperature is kept below the 962° C. melting point of silver. Typically, peak temperatures in the range of 700° C. to 900° C. are used. It is notable from the phase diagram of silver and copper (see FIG. 4(A)), that there are alloys of silver and copper ranging from pure copper through approximately a 50-50 weight percent alloy that will remain solid during the same firing profile that is used to sinter the silver used in the solar cell gridlines.

In accordance with a specific embodiment of this invention, the bus bars are printed with a silver-copper alloy ink and the gridlines are printed using substantially pure silver ink. A higher weight percentage alloy of silver in copper can form at the vertices where the gridlines and the bus bars cross. This mixing of silver from the gridlines into the copper-silver bus bar enables the metal at the vertex to melt due to the 780° C. eutectic melting point, with the preferred processing temperature being in the range of 800 and 900° C. The melting thereby can induce planarization due to the very high surface tension of liquid metals. Silver and copper both have surface tensions on the order of 1 N/m. The process will also be self-limiting to a local region around the vertex because as the eutectic melt composition dissolves more of either metal, its melting point will rise causing it to freeze.

Figure 4B:
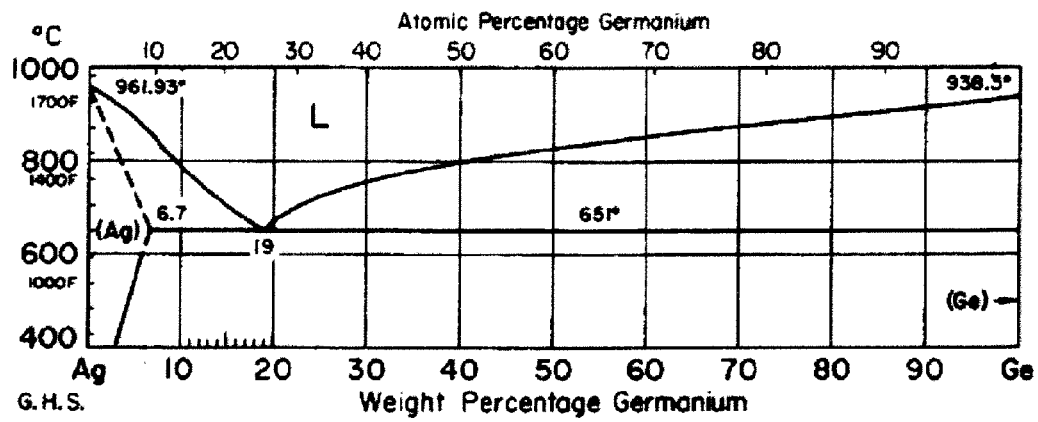

A desired feature of this invention is to have both the non-vertex portions of the bus bars and the gridlines remain in the solid phase and for the metal particles therein to undergo a solid state sintering reaction while the vertices undergo a liquid phase reaction. Referring to FIG. 4, this can be achieved by making the gridlines silver rich relative to the eutectic composition and making the bus bars copper rich relative to the eutectic composition. This is a more general embodiment of the case described above in which the gridline ink contains particles of pure silver. Alternately, the gridlines can be copper rich relative to the eutectic composition and the bus bars can be copper rich relative to the eutectic composition. This compositional arrangement will also result in a lower melting point at the vertices relative to both gridlines and bus bars. It is worth noting that in some types of solar cells, including silicon solar cells, copper can degrade cell performance, so in some applications, a buffer layer of some type may be necessary under the bus bars and or gridlines.

In an alternative embodiment, the eutectic melting method is utilized with silver-germanium ink in place of silver-copper. The phase diagram for silver-germanium is provided in FIG. 4(B). Silver-germanium has the advantage that Ge is not a deep level trap in Si, and therefore it is less critical to prevent the Ge from getting into the Si.

Figure 5:
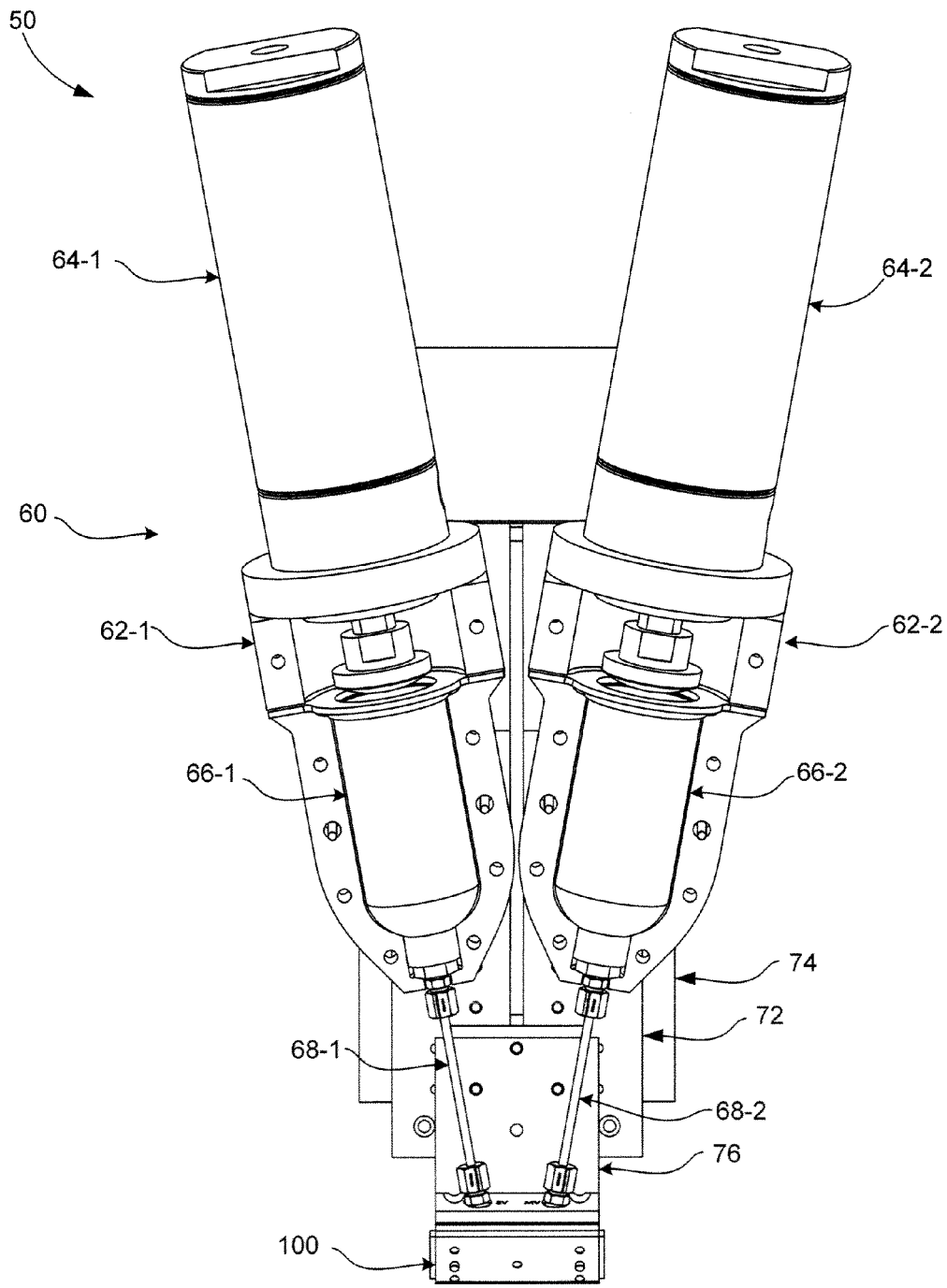
FIG. 5 is a front view showing a micro-extrusion system including a generalized co-extrusion printhead assembly utilized in accordance with another embodiment of the present invention.
Figure 6:
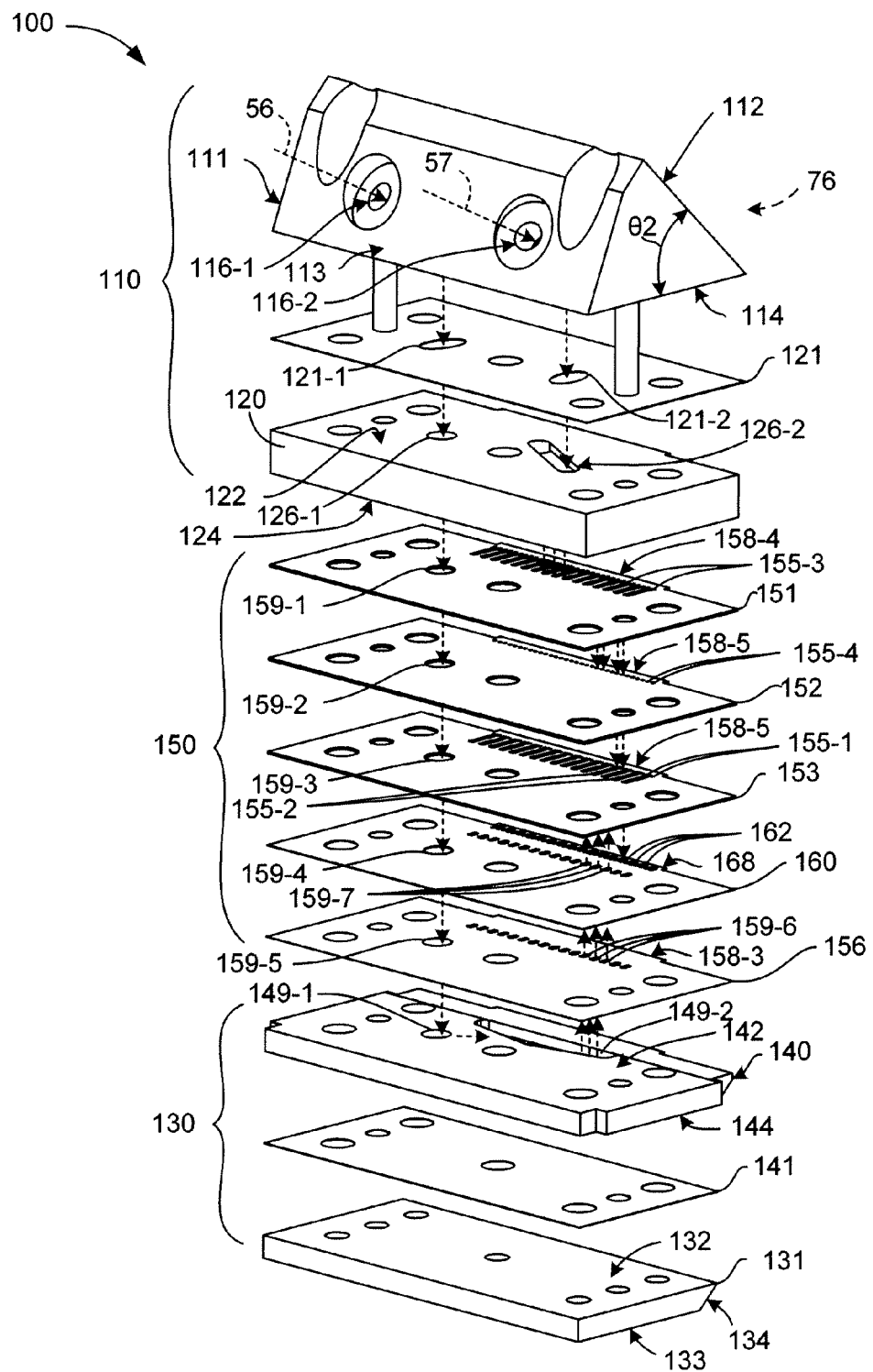
FIG. 6 is an exploded perspective view showing the co-extrusion printhead assembly utilized in the system of FIG. 5 in additional detail.
Figure 7:
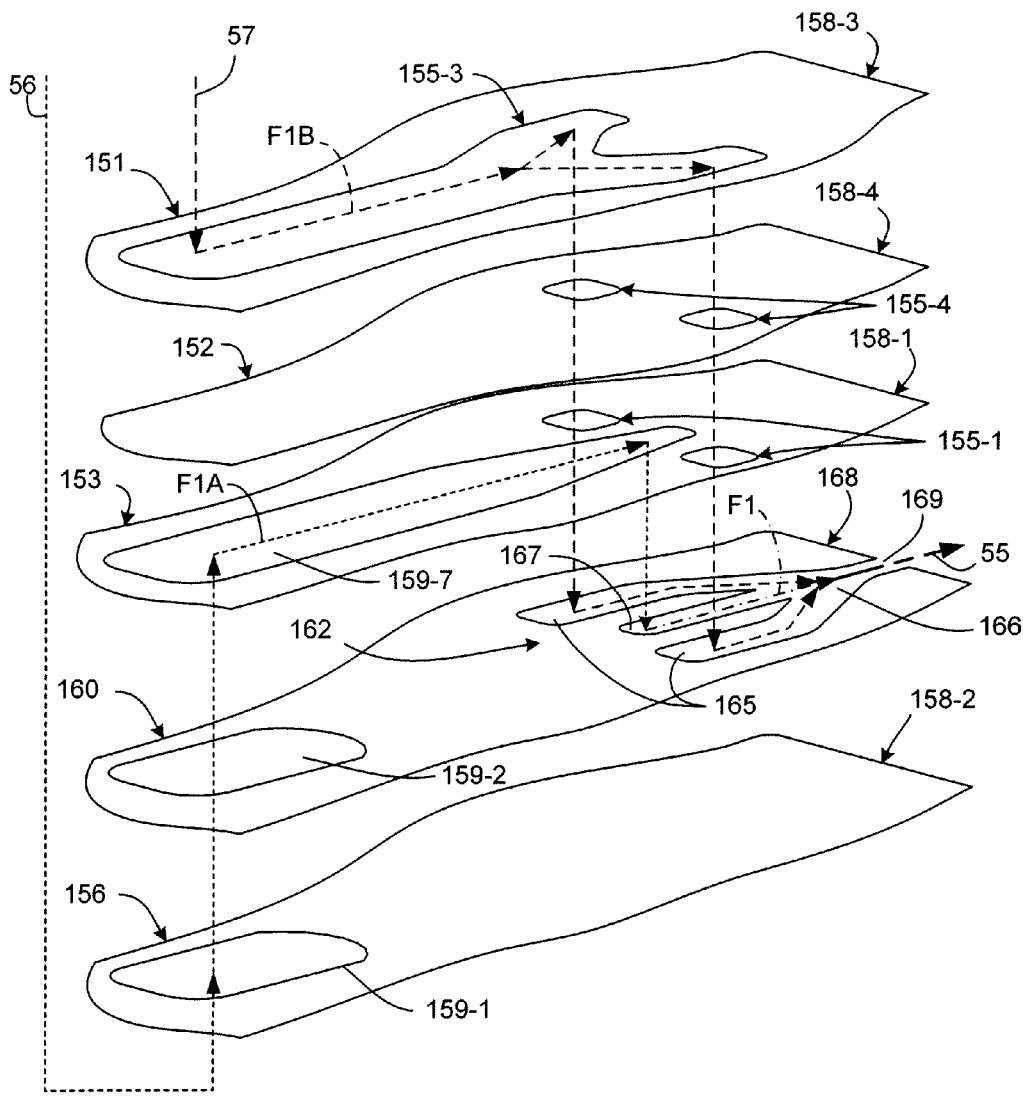
FIG. 7 is a simplified exploded partial perspective view showing a portion of a generalized layered nozzle structure utilized in the co-extrusion printhead assembly of FIG. 5.

As mentioned above, according to an embodiment of the present invention, one or both of the bus bar ink and the gridline ink are printed using a micro-extrusion system onto substrate 41. The exemplary micro-extrusion system set forth below with reference to FIGS. 5-7 illustrate a co-extrusion system utilized in conjunction with a specific embodiment set forth below. Single extrusion systems operate in a manner similar to the co-extrusion system, and are disclosed in additional detail in co-owned and co-pending U.S. patent application Ser. No. 12/267,069, entitled "DIRECTIONAL EXTRUDED BEAD CONTROL", filed Nov. 7, 2008, which is incorporated herein by reference in its entirety.

Figure 8:
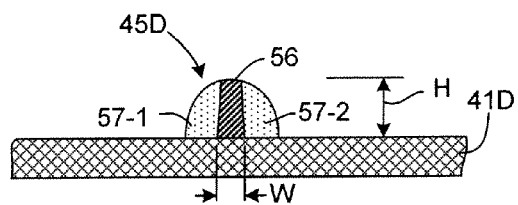
FIG. 8 is a cross-sectional side view showing an exemplary co-extruded gridline structure generated on a substrate surface by the co-extrusion printhead assembly of FIG. 7.

FIGS. 5-8 illustrate a co-extrusion system 50 including a material feed system 60 having means for supplying two extrusion materials to a printhead assembly 100, where printhead assembly 100 includes means for co-extruding the two extrusion materials in a manner that generates parallel high-aspect ratio gridline structures (described below with reference to FIG. 8).

Referring to FIG. 5, material feed system 60 represents exemplary experimental arrangement utilized to produce solar cells on a small scale, and those skilled in the art will recognize that other arrangements would typically be used to produce solar cells on a larger scale. Referring to the upper portion of FIG. 5, material feed system 60 includes a pair of housings 62-1 and 62-2 that respectively support pneumatic cylinders 64-1 and 64-2, which is operably coupled to cartridges 66-1 and 66-2 such that material forced from these cartridges respectively passes through feedpipes 68-1 and 68-2 into printhead assembly 100. As indicated in the lower portion of FIG. 5, the Z-axis positioning mechanism (partially shown) includes a Z-axis stage 72 that is movable in the Z-axis (vertical) direction by way of a housing/actuator 74 (partially shown) using known techniques. Mounting plate 76 is rigidly connected to a lower end of Z-axis stage 72 and supports printhead assembly 100, and a mounting frame (not shown) is rigidly connected to and extends upward from Z-axis stage 72 and supports pneumatic cylinders 64-1 and 64-2 and cartridges 66-1 and 66-2.

FIG. 6 is an exploded perspective view showing micro-extrusion printhead 100 in additional detail. Micro-extrusion printhead 100 includes a first (back) plate structure 110, a second (front) plate structure 130, and a layered nozzle structure 150 connected therebetween.

Back plate structure 110 and front plate structure 130 serve to guide the extrusion material from corresponding inlet ports 116-1 and 116-2 to layered nozzle structure 150, and to rigidly support layered nozzle structure 150 such that extrusion nozzles 162 defined in layered nozzle structure 150 are pointed toward substrate 51 at a predetermined tilted angle (e.g., 45°), whereby extruded material traveling down each extrusion nozzle 162 toward its corresponding nozzle orifice 169 is directed toward a target substrate.

Referring to the upper portion of FIG. 6, back plate structure 110 includes a molded or machined metal (e.g., aluminum) angled back plate 111, a back plenum 120, and a back gasket 121 disposed therebetween. Angled back plate 111 includes a front surface 112, a side surface 113, and a back surface 114, with front surface 112 and back surface 114 forming predetermined angle θ2 (e.g., 45°). Angled back plate 111 also defines a pair of bores (not shown) that respectively extend from threaded countersunk bore inlets 116-1 and 116-2 defined in side wall 113 to corresponding bore outlets defined in back surface 114. Back plenum 120E includes parallel front surface 122 and back surface 124, and defines a pair of conduits (not shown) extending from corresponding inlets 126-1 and 126-2 defined through front surface 122 to corresponding outlets (not shown) defined in back surface 124. Similar to the description provided above, the bores/conduits defined through back plate structure 110 feed extrusion material to layered nozzle structure 150.

Referring to the lower portion of FIG. 6, front plate structure 130 includes a molded or machined metal (e.g., aluminum) front plate 131, a front plenum 140, and a front gasket 141 disposed therebetween. Front plate 131 includes a front surface 132, a side surface 133E, and a beveled back surface 134, with front surface 132 and back surface 134E forming the predetermined angle described above. Front plate 131 defines several holes for attaching to other sections of printhead assembly 100, but does not channel extrusion material. Front plenum 140 includes parallel front surface 142 and back surface 144, and defines a conduit (not shown) extending from corresponding inlet 148 to a corresponding outlet 149, both being defined through front surface 142. As described below, the conduit defined in front plenum 140 serves to feed one of the extrusion materials to layered nozzle structure 150.

Layered nozzle structure 150 includes a top nozzle plate 153, a bottom nozzle plate 156, and a nozzle outlet plate 160 sandwiched between top nozzle plate 153 and bottom nozzle plate 156. As described in additional detail below, top nozzle plate 153 defines a row of substantially circular inlet ports (through holes) 155-1 and a corresponding series of elongated inlet ports 155-2 that are aligned adjacent to a (first) front edge 158-1. Bottom nozzle plate 156 is a substantially solid (i.e., continuous) plate having a (third) front edge 158-2, and defines several through holes 159-6. Nozzle outlet plate 160 includes a (second) front edge 168, and defines a row of three-part nozzle channels 162, and several through holes 159-7 that are aligned with through holes 159-6. When operably assembled, nozzle outlet plate 160 is sandwiched between top nozzle plate 153 and bottom nozzle plate 156 to form a series of nozzles in which each three-part nozzle channel 162 is enclosed by corresponding portions of top nozzle plate 153 and bottom nozzle plate 156, with each part of three-part nozzle channel 162 aligned to receive material from two inlet ports 155-1 and one elongated inlet port 155-2. This arrangement produces parallel high-aspect ratio gridline structures (beads) in which a primary material is pressed between two secondary material sections.

In addition to top nozzle plate 153, bottom nozzle plate 156 and nozzle outlet plate 160, layered nozzle structure 150 also includes a first feed layer plate 151 and a second feed layer plate 152 that are stacked over top nozzle plate 153 and served to facilitate the transfer of the two extrusion materials to nozzle outlet plate 160. First feed layer plate 151 is a substantially solid (i.e., continuous) plate having a (fourth) front edge 158-4, and defines several Y-shaped through holes 155-3 located adjacent to front edge 158-4, and several feed holes 159-1. Second feed layer plate 152 is disposed immediately below first feel layer plate 151, includes a (fifth) front edge 158-5, and defines several substantially circular through holes 155-4 located adjacent to front edge 158-5, and several feed holes 159-2.

As indicated by the dashed arrows in FIG. 6, two extrusion materials are fed by way of two separate paths in a substantially Z-axis direction through the various layers of layered nozzle structure 150 to nozzle outlet plate 160. The two flow paths are described in detail in the following paragraphs.

Referring to the upper portion of FIG. 6, primary material 56 injected through inlet port 116-1 is fed downward through opening 121-1 in back gasket 121 and into opening 126-1 defined in back plenum 120. The primary material then exits back plenum 120 and passes through aligned openings 159-1 to 159-5 respectively formed in first feed layer plate 151, second feed layer plate 152, top nozzle plate 153, nozzle outlet plate 160, and bottom nozzle plate 156 before entering opening 149-1 of front plenum 140. As indicated in FIG. 6, the primary material is then redirected by front plenum 140 and moves upward from opening 149-2 through opening 159-6 formed in bottom nozzle plate 156 and opening 159-7 formed in nozzle outlet plate 160. As indicated in FIG. 7, the primary material then enters the rearward end of elongated openings 159-7, and is redirected in a substantially horizontal direction along arrow F1A to the front end of elongated opening 159-7. The primary material is then forced downward into a central channel 167 of three-part nozzle channel 162. As described in additional detail below, the primary material then flows along central channel 167 in the direction of arrow F1, and is compressed between corresponding secondary material portions before exiting from orifice 169.

Referring again to the upper portion of FIG. 6, secondary material 57 injected through inlet port 116-2 is fed downward through opening 121-2 in back gasket 121 and into opening 126-2 defined in back plenum 120. The secondary material is dispersed by plenum 120 and is passed into the rearward end of Y-shaped elongated channels 155-3, which are formed in first feed layer plate 151. As indicated by dashed arrows in FIGS. 6 and 7, the secondary material flows along each Y-shaped elongated channel 155-3 to a split front end region, where the secondary material is distributed through corresponding openings 155-4 disposed in second feed layer plate 152 and openings 155-1 disposed in top nozzle plate 153, and then into opposing side channel 165 of three-part nozzle channel 162. The secondary material then flows along side channels 165, and presses against the corresponding primary material before exiting from orifice 169.

Referring to FIG. 7, nozzle output plate 160 includes a plate that is micro-machined (e.g., using deep reactive ion etching) to include arrowhead-shaped three-part nozzle channel 162 including a central channel 167 and opposing (first and second) side channels 165. Central channel 167 is separated from each side channel 165 by an associated tapered finger of plate material. Central channel 167 has a closed end that is aligned to receive primary material from the front end of elongated opening 159-7 of top nozzle plate 153, and an open end that communicates with a merge point 166. Similarly, side channels 165 have associated closed ends that are aligned to receive secondary material from corresponding openings 155-1 of top nozzle plate 153, and open ends that communicate with a merge point 166. Side channels 165 are angled toward central channel 167 such that secondary material is fed against opposing sides of the primary material flowing in central channel 167.

As shown in FIG. 8, the primary material and secondary material co-extruded through each nozzle outlet orifice 169 (see FIG. 7) of co-extrusion printhead assembly 100 during the extrusion process forms an elongated extruded structure 45D on substrate 41D such that the primary material of each structure 45D forms a high-aspect ratio gridline structure 56, and such that the secondary material of each structure 45D forms associated first and second secondary material portions 57-1 and 57-2 respectively disposed on opposing sides of the associated high-aspect ratio gridline 56. The shape of extruded structures 45D (i.e., the aspect ratio of primary material 56 and the shape of secondary portions 57-1 and 57-2) are controllable through at least one of the shapes of the one or more outlet orifices and internal geometry of printhead assembly 100, characteristics of the materials (e.g., viscosity, etc.), and the extrusion technique (e.g., flow rate, pressure, temperature, etc.).

In accordance with another embodiment of the present invention, co-printhead assembly 100 and system 50 are utilized to produce bus bar structure 45D (see FIG. 8) including a flux as the "primary" material passed through the central channel of printhead assembly 100 (i.e., such that the flux forms central structure 56 in FIG. 8), and silver (Ag) as the "secondary" material passed through the side channels of printhead assembly 100 (i.e., such that silver forms side structures 57-1 and 57-2). The flux helps to get the low aspect ratio bus bars because of clogging issues with mono extrusion printing. Gridlines are subsequently printed that overlap bus bars 45D in the manner described above. The flux serves as a deliquescing material, inducing a chemical reaction between the flux and the gridline ink such that the elevated gridline portions slump onto the bus bars in the manner described above.

Although the present invention has been described with respect to certain specific embodiments, it will be clear to those skilled in the art that the inventive features of the present invention are applicable to other embodiments as well, all of which are intended to fall within the scope of the present invention. For example, although the present invention is described herein with specific reference to extrusion printing, other printing methods (e.g., ink jet printing, screen printing) may be utilized to print one or both of the bus bar and gridline structures described herein. Further, other methods for planarizing the gridlines may be use, such as by directing a laser beam onto each elevated gridline portion with sufficient energy to induce the desired localized melting, or by applying a mechanical force onto elevated gridline portions. In yet another alternative method, the gridline ink is printed in the form of a gel including a copolymer in a non-aqueous suspension, and localized melting is induced by heating the elevated gridline portions (e.g., by selectively heating the vertices using laser pulses) such that the copolymer causes the gel to liquefy and flow over the bus bar.

The invention claimed is:

1. A solar cell comprising:
a substrate having an upper surface;
one or more bus bars that extend in a first direction across the upper surface of the substrate; and
a plurality of parallel gridlines that extend in a second direction across the upper surface of the substrate, the second direction defining an angle with the first direction such that each gridline of the plurality of parallel gridlines intersects the one or more bus bars, whereby one or more first gridline portions of each said gridline is disposed directly on the upper surface of the substrate, and one or more second gridline portions is disposed on the one or more bus bars,
wherein said one or more bus bars consist essentially of a first silver-germanium alloy ink having a first melting point temperature,
wherein each said gridline of said plurality of parallel gridlines consists essentially of a second silver alloy ink having a higher silver content than that of the first ink and having a second melting point temperature, and
wherein the first and second inks are selected such that contact between said second gridline portions and said one or more bus bars produces a third chemical composition having a third melting point temperature that is lower that said first and second melting point temperatures.

2. A solar cell comprising:
a substrate having an upper surface;
one or more bus bars that extend in a first direction across the upper surface of the substrate; and
a plurality of parallel gridlines that extend in a second direction across the upper surface of the substrate,
wherein each gridline of said plurality of parallel gridlines intersects the one or more bus bars such that said each of said plurality of parallel gridlines includes:
a first gridline portion contacting the substrate and having a cross-sectional shape including a first aspect ratio, and
a second gridline portion disposed on the at least one bus bar and having a cross-sectional shape including a second aspect ratio that is lower than said first aspect ratio,
wherein said one or more bus bars consist essentially of a first silver-germanium alloy ink,
wherein each gridline of said plurality of parallel gridlines consists essentially of a second silver alloy ink having a higher silver content than that of the first ink, and
wherein the second gridline portion is melted onto the at least one bus bar such that the first ink and the second ink produce a combined third chemical composition.

3. A solar cell comprising:
a substrate having an upper surface;
a bus bar that extends in a first direction across the upper surface of the substrate; and
a plurality of parallel gridlines that extend in a second direction across the upper surface of the substrate,
wherein each gridline of said plurality of parallel gridlines intersects the bus bar such that said each of said plurality of parallel gridlines includes:
a first gridline portion and a third gridline portion respectively contacting the substrate on opposite sides of the bus bar, both of said first and third gridline portions having a cross-sectional shape including a first aspect ratio, and
a second gridline portion disposed on the at least one bus bar and extending between the first and third gridline portions, said second gridline portion having a cross-sectional shape including a second aspect ratio that is lower than said first aspect ratio,
wherein said one or more bus bars consist essentially of a first silver-germanium alloy ink,
wherein each gridline of said plurality of parallel gridlines consists essentially of a second silver alloy ink having a higher silver content than that of the first ink, and
wherein the second gridline portion is melted onto the at least one bus bar such that the first ink and the second ink produce a combined third chemical composition.

* * * * *